(12) United States Patent
Hirai et al.

(10) Patent No.: US 11,492,149 B2
(45) Date of Patent: Nov. 8, 2022

(54) MULTI-LAYER INSULATION OF SPACECRAFT STRUCTURE FOR COSMIC DUST IMPACT DAMAGE MONITORING

(71) Applicant: Japan Aerospace Exploration Agency, Tokyo (JP)

(72) Inventors: Takayuki Hirai, Tokyo (JP); Hajime Yano, Kanagawa (JP)

(73) Assignee: JAPAN AEROSPACE EXPLORATION AGENCY

( * ) Notice: Subject to any disclaimer, the term of this patent is extended or adjusted under 35 U.S.C. 154(b) by 980 days.

(21) Appl. No.: 16/219,993

(22) Filed: Dec. 14, 2018

(65) Prior Publication Data
US 2019/0193874 A1   Jun. 27, 2019

(30) Foreign Application Priority Data

Dec. 22, 2017   (JP) .............................. JP2017-246925

(51) Int. Cl.
*B64G 1/68* (2006.01)
*B64G 1/58* (2006.01)
*G01M 5/00* (2006.01)
*G01M 3/40* (2006.01)
*H01L 41/113* (2006.01)
(Continued)

(52) U.S. Cl.
CPC .................. *B64G 1/68* (2013.01); *B64G 1/58* (2013.01); *G01M 3/40* (2013.01); *G01M 5/0083* (2013.01); *B32B 27/281* (2013.01); *B32B 27/304* (2013.01); *B32B 2307/202* (2013.01);
(Continued)

(58) Field of Classification Search
CPC .. B64G 1/68; B64G 1/58; B64G 1/66; G01M 3/40; G01M 5/0083; B32B 27/281; B32B 27/304; B32B 2307/202; B32B 2307/304; B32B 2605/00; B32B 3/266; B32B 2255/10; B32B 2255/205; B32B 2307/20; B32B 2307/732; B32B 7/09; B32B 7/12;
(Continued)

(56) References Cited

U.S. PATENT DOCUMENTS

| 3,324,388 A * | 6/1967 | Davison | .................. B64G 1/68 |
| | | | 340/870.37 |
| 5,195,046 A * | 3/1993 | Gerardi | ................. B64D 15/20 |
| | | | 73/659 |

(Continued)

FOREIGN PATENT DOCUMENTS

| CA | 2712411 A1 * | 7/2009 | ............... B64G 1/68 |
| EP | 2131409 A1 * | 12/2009 | .......... B41J 2/14233 |

(Continued)

OTHER PUBLICATIONS

Japanese Office Action, dated Nov. 2, 2021, issued in corresponding Japanese Patent Application No. 2017-246925. English translation. Total 6 pages.

(Continued)

*Primary Examiner* — Behrang Badii
*Assistant Examiner* — Jalal C Coduroglu
(74) *Attorney, Agent, or Firm* — Ostrolenk Faber LLP

(57) ABSTRACT

A multi-layer insulation includes a plurality of layers that are laminated on each other. A detection layer that is at least one of the plurality of layers has a piezoelectric film, and a pair of electrode parts installed on both surfaces of the piezoelectric film.

10 Claims, 5 Drawing Sheets

(51) Int. Cl.
*B32B 27/30* (2006.01)
*B32B 27/28* (2006.01)

(52) U.S. Cl.
CPC ..... *B32B 2307/304* (2013.01); *B32B 2605/00* (2013.01); *H01L 41/1132* (2013.01); *H01L 41/1138* (2013.01)

(58) Field of Classification Search
CPC ..... B32B 27/08; B32B 27/36; B32B 2250/24; H01L 41/1132; H01L 41/1138
See application file for complete search history.

(56) References Cited

U.S. PATENT DOCUMENTS

| | | | | |
|---|---|---|---|---|
| 5,604,431 | A * | 2/1997 | Serna | G01N 15/10 250/385.1 |
| 6,469,785 | B1 * | 10/2002 | Duveneck | G01N 21/648 422/82.11 |
| 7,805,276 | B1 * | 9/2010 | Byers | H01L 41/1132 310/334 |
| 9,205,969 | B2 * | 12/2015 | Deane | B65D 81/3813 |
| 2004/0100200 | A1 * | 5/2004 | Takeuchi | G09G 3/22 315/169.3 |
| 2005/0269913 | A1 * | 12/2005 | Sasaki | B41J 2/14274 310/366 |
| 2009/0302713 | A1 * | 12/2009 | Bayer | H01L 41/0533 29/25.35 |
| 2010/0225710 | A1 * | 9/2010 | Iwashita | H01L 41/083 310/358 |
| 2011/0050258 | A1 * | 3/2011 | Katazawa | B64G 1/68 324/693 |
| 2013/0176049 | A1 * | 7/2013 | Bauer | B64G 1/56 324/761.01 |
| 2013/0306656 | A1 * | 11/2013 | Eckhoff | B65D 81/3834 62/304 |
| 2015/0123516 | A1 * | 5/2015 | Rinner | H01L 41/0471 310/365 |
| 2015/0338306 | A1 * | 11/2015 | Dunne | G01M 5/0066 73/587 |
| 2017/0205297 | A1 * | 7/2017 | Rickman | G01L 5/0052 |
| 2021/0175822 | A1 * | 6/2021 | Ban | B64F 5/60 |

FOREIGN PATENT DOCUMENTS

| | | | | |
|---|---|---|---|---|
| JP | H01-202600 | A | | 8/1989 |
| JP | H06-219399 | A | | 8/1994 |
| JP | H11-227699 | A | | 8/1999 |
| JP | 2003-128000 | A | | 5/2003 |
| JP | 2017-203705 | A | | 11/2007 |
| JP | 2009200358 | A | * 9/2009 | ......... B41J 2/14233 |
| JP | 2010258025 | A | * 11/2010 | ......... G01N 27/205 |
| JP | 4655504 | B2 | * 3/2011 | ......... G01N 27/205 |
| JP | 2016066677 | A | * 4/2016 | ......... G01N 27/205 |
| WO | WO-2009091037 | A1 | * 7/2009 | ......... B64G 1/68 |
| WO | WO-2016031667 | A1 | * 3/2016 | ......... B32B 3/12 |
| WO | WO-2017079496 | A1 | * 5/2017 | ......... G01V 1/18 |

OTHER PUBLICATIONS

G. Drolshagen et al., "Measurements of Cosmic Dust and Micro-Debris With the Gorid Impact Detector in Geo," Proceedings of the Third European Conference on Space Debris, Mar. 19-21, 2001, vol. 1, pp. 177-184.

E.A. Taylor et al., "Impacts On HST and Eureca Solar Arrays Compared With LDEF Using a New Glass-to-Aluminium Conversion", Adv. Space Res., 1999, vol. 23, No. 1, pp. 83-87.

Ryu Funase, ISAS News, Oct. 2017, No. 439, brochure Ver., 8 pages, with partial English translation.

Ryu Funase, ISAS News, Oct. 2017, No. 439, Web Ver., URL address; http://www.isas.jaxa.jp/feature/forefront/171020.html: download date: Dec. 28, 2017, 6 pages (see partial English translation of the brochure version of Ryu Funase cited above).

* cited by examiner

MULTI-LAYER INSULATION OF SPACECRAFT STRUCTURE FOR COSMIC DUST IMPACT DAMAGE MONITORING

CROSS-REFERENCE TO RELATED APPLICATION

Priority is claimed on Japanese Patent Application No. 2017-246925, filed Dec. 22, 2017, the content of which is incorporated herein by reference.

BACKGROUND OF THE INVENTION

Field of the Invention

The present invention relates to a multi-layer insulation, a spacecraft, a damage diagnosis device, and a method of detecting an object to be detected.

Description of Related Art

In the related art, in order to secure safety in space applications, it is required to ascertain the distribution of fine space debris surrounding the Earth. Meanwhile, in deep space, in order to elucidate important issues in planetary science and astronomy such as the formation of the solar system, it is important to understand the distribution of cosmic dust. As a method of measuring fine particles such as space debris, cosmic dust, and so on, there is a method of electrically detecting collisions of fine particles by measuring a plasma or the like (for example, see Non-Patent Document 1).

In addition, a method of estimating a size distribution of fine particles by exposing a member in outer space, recovering the member to the ground and investigating impact marks is known (for example, see Non-Patent Document 2).

CITATION LIST

Non-Patent Documents

[Non-Patent Document 1]
G. Drolshagen, H. Svedhem, and E. Gruen, "MEASUREMENTS OF COSMIC DUST AND MICRO-DEBRIS WITH THE GORID IMPACT DETECTOR IN GEO", The Third European Conference on Space Debris, 19-21 Mar. 2001, Vol. 1, p. 177-184

[Non-Patent Document 2]
E. A. Taylor, N. R. G. Shrine, N. McBride, S. F. Green, J. A. M. McDonnell, and G. Drolshagen, "IMPACTS ON HST AND EURECA SOLAR ARRAYS COMPARED WITH LDEF USING A NEW GLASS-TO-ALUMINIUM CONVERSION", Adv. Space Res., 1999, Vol. 23, p. 83-87

SUMMARY OF THE INVENTION

A particularly important size range of diameters of fine particles is tens to hundreds of μm (micrometers). However, with an area (about 0.1 m$^2$) of a sensor in the related art such as Non-Patent Document 1 or the like, measurement of a distribution of fine particles whose diameter is several μm is limit. Since a mass of a sensor increases as an area of the sensor is increased, it is difficult to mount this sensor on a spacecraft. Further, since deployment of mounted devices in a wide area on a surface of a spacecraft requires specific consideration regarding thermal design/control, like an increase in mass of the spacecraft, this deployment cannot be universally performed.

In addition, in a method disclosed in Non-Patent Document 2, a frequency of performing estimation of a size distribution of fine particles is extremely limited. For this reason, it is impossible to continuously measure a distribution of fine particles in the entire trajectory of the Earth.

In consideration of the above-mentioned problems, the present invention is directed to providing a multi-layer insulation with which an increase in mass of a spacecraft on which the multi-layer insulation is mounted is able to be suppressed and a distribution of fine particles is able to be measured by a wide sensor area, a spacecraft including the multi-layer insulation, a damage diagnosis device, and a method of detecting an object to be detected using the multi-layer insulation.

(1) According to a first aspect of the present invention, a multi-layer insulation includes a plurality of layers that are laminated on each other, wherein a detection layer that is at least one of the plurality of layers has: a piezoelectric film; and a pair of electrode parts installed on both surfaces of the piezoelectric film.

According to this aspect, the detection layer has the piezoelectric film and the pair of electrode parts and is thinly configured. For this reason, for example, even when the multi-layer insulation is mounted on a spacecraft, an increase in mass of the spacecraft can be suppressed. That is, by employing the multi-layer insulation of the present aspect instead of the multi-layer insulation in the related art, an increase in mass of the spacecraft can be suppressed. When fine particles such as space debris, cosmic dust, and so on, collide with the detection layer, the piezoelectric film of the detection layer is compressed or the like by the collision of the fine particles, and a potential difference occurs between the pair of electrode parts. Since the fine particles are detected by detecting the potential difference and further the fine particles are detected over a wide area in outer space, a distribution of the fine particles in outer space can be measured.

In addition, since the multi-layer insulation is mounted on the spacecraft throughout an area in which a heat insulating material is formed and the heat insulating material is formed on most of the outer surface of the spacecraft, a distribution of the fine particles can be measured with a wide sensor area.

(2) According to a second aspect of the present invention, in the multi-layer insulation according to (1), the detection layer may not be disposed on at least one end of the plurality of layers in a lamination direction in which the plurality of layers are laminated.

According to this aspect, for example, the multi-layer insulation may be mounted on a spacecraft such that an end in the lamination direction on which the detection layer is not disposed is exposed to outer space. The outer surface of the spacecraft is heated by light from the sun to reach a high temperature that is, for example, 100° C. or more. However, since the at least one layer is disposed closer to outer space side than to the detection layer, even when the temperature of the detection layer is lower than that of the layer disposed on the end in the lamination direction, and for example, the detection layer is formed of a piezoelectric resin having a Curie point (a temperature at which piezoelectricity is depleted due to variation in crystalline structure), the detection layer withstands the heat due to the light from the sun.

(3) According to a third aspect of the present invention, in the multi-layer insulation according to (2), the detection layer may be disposed as a second layer from an end in the lamination direction of the plurality of layers.

According to this aspect, for example, the multi-layer insulation is mounted on the spacecraft such that the end in the lamination direction is exposed to outer space. The detection layer detects fine particles that advance from outer space toward the multi-layer insulation, pass through the entire layer disposed on the outer space side of the detection layer and collide with the detection layer. Since the number of layers disposed closer to outer space side than to the detection layer is one, the fine particles that pass through the one layer can be detected by the detection layer, and detection sensitivity of the fine particles by the detection layer is improved.

(4) According to a fourth aspect of the present invention, a spacecraft includes a main body; and the multi-layer insulation according to any one of (1) to (3) and configured to cover an outer surface of the main body.

According to this aspect, a spacecraft can be configured using the multi-layer insulation capable of suppressing an increase in mass of the spacecraft on which the multi-layer insulation is mounted and measuring a distribution of the fine particles by a wide sensor area.

(5) According to a fifth aspect of the present invention, a damage diagnosis device includes the multi-layer insulation according to any one of (1) to (3); a detection unit configured to detect a potential difference between the pair of electrode parts; and a diagnosis unit configured to diagnose damage to the multi-layer insulation on the basis of detection results of the detection unit.

According to this aspect, damage to the multi-layer insulation can be diagnosed by the diagnosis unit on the basis of detection results of the detection unit.

(6) According to a sixth aspect of the present invention, a method of detecting an object to be detected is a method which detects that the object to be detected has collided with the multi-layer insulation according to any one of (1) to (3). The method of detecting an object to be detected determines that the object to be detected has collided with the detection layer when a potential difference between the pair of electrode parts exceeds a predetermined potential difference threshold.

According to this aspect, it is possible to determine that the object to be detected has collided with the multi-layer insulation when a potential difference between the pair of electrode parts exceeds a potential difference threshold.

According to the multi-layer insulation, the spacecraft, the damage diagnosis device, and the method of detecting an object to be detected described above, an increase in mass of the spacecraft on which the multi-layer insulation is mounted can be suppressed, and a distribution of fine particles can be measured by a wide sensor area.

DETAILED DESCRIPTION OF THE INVENTION

Hereinafter, an embodiment of a spacecraft according to the present invention will be described with reference to FIG. 1 to FIG. 8.

Figure 1:
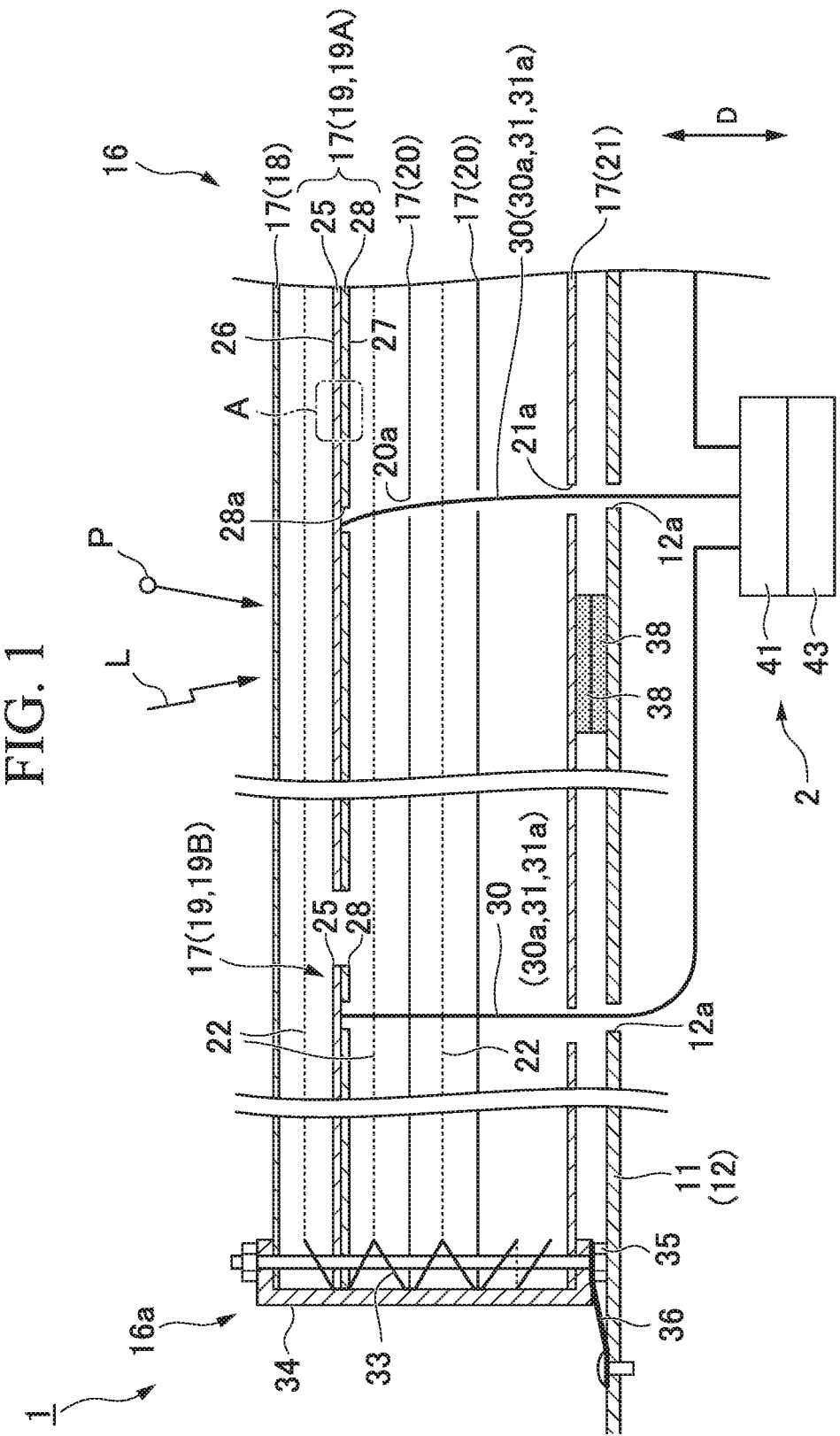
FIG. 1 is a cross-sectional view schematically showing a major part of a spacecraft according to an embodiment of the present invention.
Figure 2:
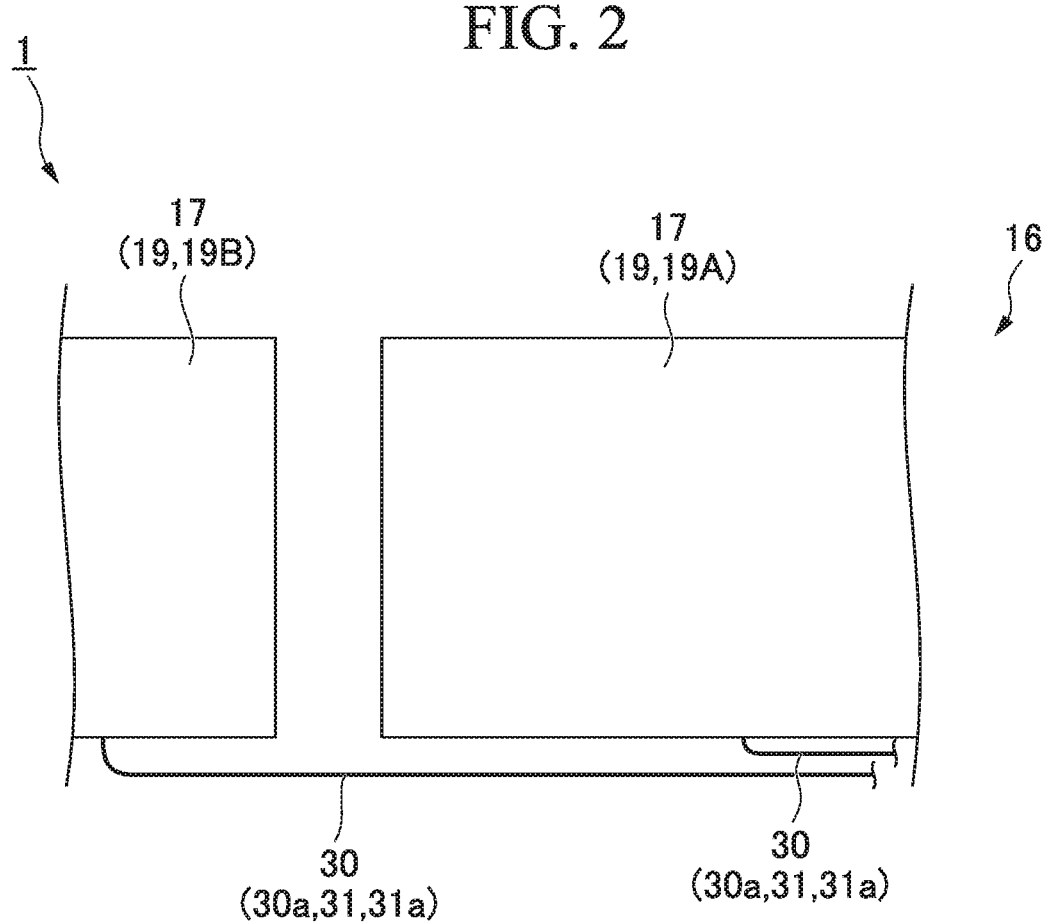
FIG. 2 is a plan view that passes through a part of the spacecraft.

As shown in FIG. 1 and FIG. 2, a spacecraft 1 of the embodiment includes a body structure (a main body) 11, a multi-layer insulation 16 configured to cover an outer surface of the body structure 11, a detection unit 41, and a diagnosis unit 43. Further, FIG. 1 is an exploded view of the multi-layer insulation 16. FIG. 2 is a view that passes through an outermost layer film 18 and an interval holding member 22 of the multi-layer insulation 16.

A damage diagnosis device 2 is constituted by the multi-layer insulation 16, the detection unit 41 and the diagnosis unit 43. The damage diagnosis device 2 is a health monitoring system of the multi-layer insulation 16.

A shape of the body structure 11 is not particularly limited. For example, the body structure 11 may be formed of a metal or the like in a rectangular parallelepiped box shape. Through-holes 12a into which cables 30 and 31 (to be described below) are inserted are formed in a sidewall 12 of the body structure 11.

The multi-layer insulation 16 includes a plurality of layers 17 laminated on each other.

The plurality of layers 17 include the outermost layer film 18, a detection layer 19, an intermediate layer film 20, and an innermost layer film 21. The outermost layer film 18, the detection layer 19, the intermediate layer film 20 and the innermost layer film 21 are disposed to be arranged in sequence from one side toward the other side in a lamination direction D in which the plurality of layers 17 are laminated.

The outermost layer film 18 is formed on at least one surface of a polyimide film by performing, for example, aluminum deposition. A thickness of the outermost layer film 18 is about 25 μm (micrometers) or more and 50 μm or less.

Figure 3:
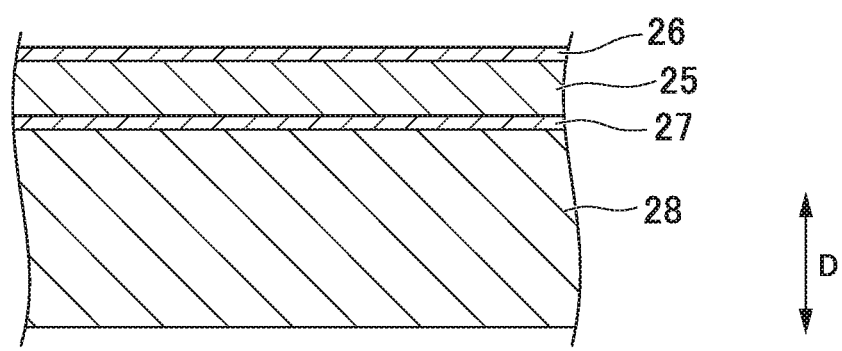
FIG. 3 is an enlarged view showing a portion A in FIG. 1.

The detection layer 19 is one of the plurality of layers 17. The detection layer 19 is disposed as a second layer from one end side in the lamination direction D of the plurality of layers 17. The detection layer 19 is not disposed at one end in the lamination direction D. As shown in FIG. 3, the detection layer 19 includes a piezoelectric film 25 and a pair of electrode layers (electrode parts) 26 and 27.

For example, the piezoelectric film 25 is formed in a rectangular shape when seen in a plan view in the lamination direction D. The piezoelectric film 25 is formed of, for example, polyvinylidene fluoride (PVDF). The piezoelectric film 25 has piezoelectricity. When the piezoelectric film 25 is deformed in the lamination direction D, a potential difference is generated between both end portions in the lamination direction D. Further, the piezoelectric film 25 is not limited as long as the film is formed to have piezoelectricity, and may be formed of polylactic acid, lead zirconate titanate (PZT), barium titanate ($BaTiO_3$), or the like.

The first electrode layer (the electrode part) 26 is disposed on one surface of the piezoelectric film 25. The first electrode layer 26 is grounded to the body structure 11 or the like and becomes a ground (GND) surface. Further, the first electrode layer 26 and the body structure 11 may be insulated from each other when the first electrode layer 26 constitutes a secondary GND and the body structure 11 constitutes a primary GND. In this case, a protective film having insulation may be adhered onto the first electrode layer 26.

The second electrode layer (the electrode part) 27 is disposed on the other side of the piezoelectric film 25. The second electrode layer 27 becomes a HOT (hot; live-lined) surface without grounded to the body structure 11 or the like. The electrode layers 26 and 27 are formed in a layered form through aluminum deposition or the like on the piezoelectric film 25. The first electrode layer 26 is disposed throughout one surface of the piezoelectric film 25. The second electrode layer 27 is disposed throughout the other surface of the piezoelectric film 25. The electrode layers 26 and 27 are formed in the same rectangular shape as the piezoelectric film 25 when seen in a plan view.

A thickness of the detection layer 19 is, for example, about 20 μm.

In the embodiment, a second protective film 28 is disposed on a side of the second electrode layer 27 opposite to the piezoelectric film 25. The second protective film 28 is formed of polyimide or the like. A thickness of the second protective film 28 is, for example, about 100 μm. The second electrode layer 27 and the second protective film 28 are adhered to each other by a tape (not shown) having adhesive layers on both surfaces thereof.

Since the GND surface has the same potential as that of the plurality of layers 17 of the grounded multi-layer insulation 16, only the HOT surface need be electrically insulated. For this reason, the second electrode layer 27 that is the HOT surface is covered with the second protective film 28.

A first electrical wire 30a of the first cable 30 shown in FIG. 1 and FIG. 2 is connected to the first electrode layer 26. The first cable 30 has the first electrical wire 30a, and a first coating material (a reference numeral thereof is omitted) configured to cover an outer surface of the first electrical wire 30a. The first electrical wire 30a is connected to an intermediate portion of an outer edge portion extending in a predetermined direction in the first electrode layer 26 when seen in the lamination direction D.

A second electrical wire 31a of the second cable 31 is connected to the second electrode layer 27. The second cable 31 has the second electrical wire 31a, and a second coating material (a reference numeral thereof is omitted) configured to cover an outer surface of the second electrical wire 31a. The second electrical wire 31a is connected to an intermediate portion of an outer edge portion extending in a predetermined direction in the second electrode layer 27 when seen in the lamination direction D. The first coating material and the second coating material have electrical insulation.

The cables 30 and 31 are inserted into through-holes 28a, 20a and 21a formed in the second protective film 28, the intermediate layer film 20 and the innermost layer film 21, respectively, and the through-hole 12a of the sidewall 12. The through-holes 28a, 20a, 21a and 12a are disposed to be arranged in the lamination direction D.

However, the through-holes 28a, 20a, 21a and 12a may be disposed to be arranged in sequence from one side toward the other side along a main surface of the outermost layer film 18.

A plurality of intermediate layer films 20 are laminated in the lamination direction D. The intermediate layer films 20 are formed on both surfaces of a polyester film by, for example, performing aluminum deposition. A thickness of the intermediate layer films 20 is about 6 μm or more and 12 μm or less.

The innermost layer film 21 is formed on both surfaces of a polyimide film by, for example, performing aluminum deposition. A thickness of the innermost layer film 21 is, for example, about 25 μm.

Further, the detection layer 19 may not be disposed on at least one end of the plurality of layers 17 in the lamination direction D. That is, this is because, when the detection layer 19 is disposed on one end and the other end of the plurality of layers 17 in the lamination direction D, irrespective of the direction in which the multi-layer insulation 16 is disposed and fixed to the sidewall 12 of the body structure 11, the detection layer 19 of the plurality of layers 17 is disposed closest to outer space. The detection layer 19 may not be disposed on both ends of the plurality of layers 17 in the lamination direction D. The plurality of layers 17 may include detection layers 19 at two places or more in the lamination direction D.

The plurality of detection layers 19 may be disposed to be arranged between the outermost layer film 18 and the intermediate layer film 20 along a main surface of the outermost layer film 18. Hereinafter, one of the plurality of detection layers 19 is referred to as a detection layer 19A, and another one is referred to as a detection layer 19B. That is, in FIG. 1 and FIG. 2, a two-channel detection layer 19 is shown.

The interval holding member 22 is disposed between neighboring layers 17 of the plurality of layers 17 in the lamination direction D. The interval holding member 22 may preferably be formed of a material having electrical insulation properties. For example, a polyester net may be used in the interval holding member 22. A thickness of the interval holding member 22 is about 140 μm or more and 190 μm or less.

The multi-layer insulation 16 is fixed to the body structure 11 such that the outermost layer film 18 is exposed to outer space.

A sensor area disclosed herein means an area in the multi-layer insulation 16 in which fine particles such as space debris, cosmic dust, and so on, can be detected.

A method of constituting the multi-layer insulation 16 by bundling a plurality of layers 17, and fixing the multi-layer insulation 16 to the sidewall 12 of the body structure 11 is not particularly limited. In this example, a configuration described below is installed in an earth section 16a of the multi-layer insulation 16.

The detection layer 19B and the intermediate layer film 20 are sandwiched using folded aluminum foil 33 in the lamination direction D. The outermost layer film 18 and the innermost layer film 21 of the multi-layer insulation 16 are electrically connected to each other by a metal plate 34 having conductivity. The plurality of layers 17 are pressure-bonded and electrically connected to each other by a fastening metal fitting 35 such as a bolt, a rivet, or the like, in the lamination direction D. Here, neighboring layers 17 of the plurality of layers 17 in the lamination direction D come in contact with each other via the interval holding member 22.

The metal plate 34 is grounded to the sidewall 12 of the body structure 11 by an electrical wire 36 for grounding that is referred to as a bonding wire.

The multi-layer insulation 16 is fixed to the sidewall 12 by a hook and loop fastener 38. The multi-layer insulation 16 is mounted on the spacecraft 1 such that an end of one side of the plurality of layers 17 (the outermost layer film 18) in the lamination direction D is exposed to outer space.

Further, the plurality of layers 17 may be fixed to each other by suturing outer edge portions of the plurality of layers 17 using threads.

The detection unit 41 is connected to the first electrical wire 30a of the first cable 30 and the second electrical wire 31a of the second cable 31, which are connected to the detection layers 19A and 19B, respectively. The detection unit 41 is a known potentiometer or the like, and the detection unit 41 detects a potential difference between the electrode layers 26 and 27 via the cables 30 and 31. The detection unit 41 transmits a detection result to the diagnosis unit 43.

The diagnosis unit 43 has, while not shown, an arithmetic circuit, a memory, or the like. A control program configured to control the arithmetic circuit, and a potential difference threshold, a first frequency threshold, a second frequency threshold, and so on, which are previously determined, are stored in the memory. The potential difference threshold, the first frequency threshold and the second frequency threshold are determined experimentally or the like in advance. The first frequency threshold and the second frequency threshold are compared with a frequency at which fine particles P collide with the detection layers 19A and 19B, and the second frequency threshold is larger than the first frequency threshold.

The diagnosis unit 43 diagnoses damage to the multi-layer insulation 16 on the basis of the detection results of the detection unit 41.

Next, in the spacecraft 1 configured as above, a fine particle detection method of detecting that fine particles (an object to be detected) have collided with the multi-layer insulation 16 will be described.

As shown in FIG. 1, light L from the sun is radiated to the multi-layer insulation 16 from one side of the multi-layer insulation 16 in the lamination direction D. The outermost layer film 18 of the multi-layer insulation 16 is heated to a high temperature that is, for example, 100° C. or more by the light L. However, since the detection layers 19A and 19B are disposed at a second layer from an end of one side in the lamination direction D, a temperature of the detection layers 19A and 19B is lower than a temperature of the outermost layer film 18.

The fine particles P approach the multi-layer insulation 16 from outer space. The fine particles P pass through the outermost layer film 18 of the multi-layer insulation 16, and collide with the detection layer 19A. The piezoelectric film 25 of the detection layer 19A is compressed in the lamination direction D, and a potential difference generated in the piezoelectric film 25 is detected by the detection unit 41 via the cables 30 and 31. The detection unit 41 transmits a detection result to the diagnosis unit 43.

The arithmetic circuit of the diagnosis unit 43 reads a control program and a potential difference threshold. The arithmetic circuit determines whether the potential difference between the electrode layers 26 and 27 detected by the detection unit 41 exceeds a potential difference threshold. When the potential difference exceeds the potential difference threshold, the arithmetic circuit determines that the fine particles P have collided with the detection layer 19A. Meanwhile, when the potential difference is less than potential difference threshold, the arithmetic circuit determines that the fine particles P have not collided with the detection layer 19A. The arithmetic circuit stores an amplitude of the potential difference in the memory. The arithmetic circuit estimates momenta of the collided fine particles P from the amplitude of the potential difference stored in the memory.

This is the same also when the fine particles P collide with the detection layer 19B.

A time or the like when the fine particles P collide with the detection layers 19A and 19B is stored in the memory of the diagnosis unit 43. For example, the arithmetic circuit diagnoses damage to the multi-layer insulation 16 on the basis of the collision frequency of the fine particles P detected by the detection unit 41. For example, the arithmetic circuit determines that the thermal insulation performance of the multi-layer insulation 16 has not decreased (the multi-layer insulation 16 has not been damaged) when the frequency at which the fine particles P collide with the detection layers 19A and 19B is smaller than a first frequency threshold. The arithmetic circuit determines that the thermal insulation performance of the multi-layer insulation 16 has decreased by a predetermined proportion or more (the damage of the multi-layer insulation 16 has advanced a certain amount or more) when the frequency is the first frequency threshold or more and less than the second frequency threshold. The arithmetic circuit determines that the thermal insulation performance of the multi-layer insulation 16 has decreased so much that it needs replacement (the multi-layer insulation 16 is damaged so much that it needs replacement) when the frequency is the second frequency threshold or more.

Further, a method of diagnosing damage to the multi-layer insulation 16 using the damage diagnosis device 2 is not limited thereto. For example, in the diagnosis method, a collision frequency of the fine particles P detected by the detection unit 41 may be a collision frequency of the fine particles P having a predetermined diameter or more that have been detected by the detection unit 41. In this case, diameters of the fine particles P are estimated from momenta or the like of the fine particles P.

Damage to the body structure 11 may be diagnosed by totaling values obtained by weighting the frequency of collisions of the fine particles P with an amplitude of the potential difference detected by the detection unit 41 when the particles P collide with the detection layer 19A.

The damage diagnosis device may diagnoses a damage of a body structure (an object to be diagnosed) 11 having an outer surface covered with the multi-layer insulation 16.

Here, examples of a collision detection device (a damage diagnosis device) for fine particles using a conventional technology are shown in Table 1 together with a mass and a sensor area of a detection device. All examples are detection devices in that they were used for a specific mission, and there are few cases where the same detection device was installed in other missions.

TABLE 1

| Mission | Detection device | Launching Year | Measurement principle | Area (m$^2$) | Mass (kg) | Mass/area ratio (kg/m$^2$) | Documents |
|---|---|---|---|---|---|---|---|
| Galileo | DDS | 1989 | Collision electrolytic dissociation | 0.1 | 4.2 | 42 | 1 |
| EXPRESS | GORID | 1996 | Collision electrolytic dissociation | 0.1 | 4.5 | 45 | 2 |
| Cassini | CDA | 1997 | Collision electrolytic dissociation | 0.18 | 15.2 | 84 | 3 |
| ARGOS | SPADUS | 1999 | Piezoelectric element | 0.058 | 23.6 | 407 | 4 |
| New Horizons | SDC | 2006 | Piezoelectric element | 0.11 | 1.6 | 15 | 5 |
| BepiColombo | MDM | Predicted in 2017 | Piezoelectric element | 0.064 | 0.6 | 10 | 6 |

In creating Table 1, the cited documents are as follows.
(Documents)

1. E. Gruen, et al., "The Galileo Dust Detector," Space Science Reviews, 1992, Vol. 60, p. 317-340
2. G. Drolshagen, et al., "In Situ Measurement of Cosmic Dust and Space Debris in the Geostationary Orbit," 2nd European Conference on Space Debris, ESA-SP 393, 1997, p. 129-134
3. R. Srama, et al., "The Cassini Cosmic Dust Analyzer," Space Science Reviews, 2004, Vol. 114, p. 465-518
4. A. J. Tuzzolino, et al., "The Space Dust (SPADUS) instrument aboard the Earth-orbiting ARGOS spacecraft: I-instrument description," Planetary and Space Sciences, 2001, Vol. 49, p. 689-703
5. M. Horanyi, et al., "The Student Dust Counter on the New Horizons Mission," Space Science Reviews, 2008, Vol. 140, p. 387-402
6. K. Nogami, et al., Development of the Mercury dust monitor (MDM) onboard the Bepi Colombo mission," Planetary and Space Sciences, 2010, Vol. 58, p. 108-115

In addition, meanings of terms in fields of measurement principle in Table 1 are as follows.

Collision electrolytic dissociation: It means collision electrolytic dissociation plasma measurement. When fine particles collide with a sensor surface formed of a metal, plasma formed of ions and electrons caused from the sensor surface and the fine particles is generated. Collision speeds or masses of the fine particles are estimated by measuring electric charge of the plasma using an electric field formed in the detection device.

Piezoelectric element: It means piezoelectric signal measurement. A piezoelectric signal generated by collisions of the fine particles is measured, and momenta or the like of the fine particles are estimated by constituting the sensor surface using the piezoelectric element.

For example, in a mission of Galileo in Table 1, DDS was used as a detection device. A launch was performed in 1989. A measurement principle of the detection device is collision electrolytic dissociation. In the detection device, a sensor area is 0.1 m$^2$, and a mass is 4.2 kg. In this case, a mass/area ratio is 42 kg/m$^2$ from an equation of (4.2/0.1).

As shown in Table 1, a mass/area ratio of the detection device used in the related art is at least 10 kg/m$^2$. In addition, when an area of a sensor is increased, since a surface area of a body structure of a spacecraft such as a satellite or the like is occupied to some extent, specific consideration in thermal design/control of the spacecraft is needed. For this reason, an increase in area of the sensor is inhibited by problems related to not only the mass but also heat of the spacecraft.

On the other hand, according to the multi-layer insulation 16 of the embodiment, the detection layer 19A has the piezoelectric film 25 and the electrode layers 26 and 27 and is thinly configured. For this reason, even when the multi-layer insulation 16 is mounted on the spacecraft 1, an increase in mass of the spacecraft 1 is suppressed. That is, by employing the multi-layer insulation 16 of the present invention instead of the multi-layer insulation in the related art, an increase in mass of the spacecraft 1 is suppressed. When the fine particles P collide with the detection layer 19, the piezoelectric film 25 of the detection layer 19 is compressed or the like by the collisions of the fine particles P and a potential difference is generated between the electrode layers 26 and 27. Since the fine particles P are detected by detecting the potential difference and further the fine particles P are detected throughout a wide range of outer space, a distribution of the fine particles P in outer space can be measured.

In addition, the multi-layer insulation 16 can measure a distribution of the fine particles P by a wide sensor area because the multi-layer insulation 16 is mounted throughout an area in which a heat insulating material is formed on the spacecraft 1 and the heat insulating material is formed on most of the outer surface of the spacecraft 1.

The multi-layer insulation 16 of the embodiment can be adjusted to an arbitrary size, an arbitrary shape, and an arbitrary channel number to correspond to the body structure 11 of the spacecraft 1. Further, the multi-layer insulation 16 has, for example, a mass/area ratio or 0.5 kg/m$^2$, and is extremely light in comparison with the detection device in the related art. Further, the mass/area ratio also includes masses of the cables 30 and 31, the detection unit 41, and the diagnosis unit 43. Since the mass/area ratio is small, the multi-layer insulation 16 can be mounted on various spacecrafts regardless of types such as a communication satellite, a small artificial satellite (CubeSat), or the like.

By using the multi-layer insulation 16, in the earth orbiting, in the entire trajectory/period, a distribution of the fine particles P such as fine space debris or the like can be simultaneously measured at various places. Even in a deep space, a cruising science in which cost effectiveness can be maximized in limited flight opportunities becomes possible.

The detection layer 19 is not disposed on at least one end of the plurality of layers 17 in the lamination direction D. The multi-layer insulation 16 is mounted on the spacecraft 1 such that an end of one side in the lamination direction D on which the detection layer 19 is not disposed is exposed to outer space. An outer surface of the spacecraft 1 is heated by light L from the sun to become a high temperature of, for example, 100° C. or more. However, since the outermost layer film 18 is disposed closer to outer space side than to the detection layer 19, the temperature of the detection layer 19 is lower than the temperature of the outermost layer film 18, and for example, even when the detection layer 19 is formed of a piezoelectric resin having a Curie point, the detection layer 19 can withstand heat due to the light L.

The detection layer 19 is disposed at a second layer of the plurality of layers 17 from an end of one side in the lamination direction D. The detection layer 19 detects the fine particles P that advance from outer space toward the multi-layer insulation 16, pass through the outermost layer film 18 disposed closer to outer space side than to the detection layer 19 and collide with the detection layer 19. Since the number of the layers 17 disposed closer to outer space side than to the detection layer 19 is one as the outermost layer film 18, the fine particles P that pass through the outermost layer film 18 can be detected by the detection layer 19, and detection sensitivity of the fine particles P by the detection layer 19 is improved.

Since the multi-layer insulation 16 includes the cables 30 and 31, a potential difference generated between the electrode layers 26 and 27 of the detection layer 19 can be easily extracted to the outside of the multi-layer insulation 16 through electrical wires 30a and 31a.

In addition, according to the spacecraft 1 of the embodiment, the spacecraft 1 can be configured using the multi-layer insulation 16 capable of suppressing an increase in mass of the spacecraft 1 on which the multi-layer insulation 16 is mounted and measuring a distribution of the fine particles P by a wide sensor area.

In general, the multi-layer insulation is damaged and the thermal insulation performance is deteriorated due to collisions of the fine particles. However, since an amount of the damage was not evaluated by the conventional technology because an area, a frequency and a scale of the spacecraft with which the fine particles collide are not detectable. On the other hand, according to the damage diagnosis device 2 of the embodiment, damage to the body structure 11 can be diagnosed by the diagnosis unit 43 on the basis of the detection result of the detection unit 41. Since the area, the frequency and the scale of the spacecraft with which the fine particles P that remarkably damages the multi-layer insulation 16 collide can be estimated, temporal change of the thermal insulation performance of the multi-layer insulation 16 of the spacecraft 1 can be ascertained.

In addition, according to the method of detecting the fine particles P of the embodiment, when the potential difference between the electrode layers 26 and 27 exceeds the potential difference threshold, it is possible to determine that the fine particles P collide with the multi-layer insulation 16.

The multi-layer insulation 16 and the detection layer 19 of the embodiment can variously modify configurations thereof as described below.

Figure 4:
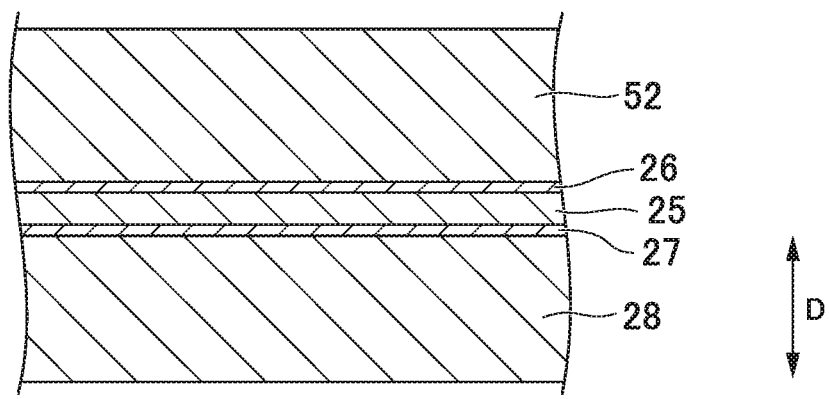
FIG. 4 is a cross-sectional view schematically showing a major part of a detection layer of a multi-layer insulation according to a modified example of the embodiment of the present invention.

A detection layer 51 shown in FIG. 4 may include a first protective film 52, in addition to the components of the detection layer 19. The first protective film 52 is configured similarly to the second protective film 28, and attached to the first electrode layer 26 similarly to the second protective film 28. Since both sides in the lamination direction D with respect to the piezoelectric film 25 are sandwiched between the protective films 28 and 52, when the fine particles P collide with the detection layer 51, the electrode layers 26 and 27 cannot be easily deformed. Accordingly, it can be configured that a short circuit between the electrode layers 26 and 27 hardly occurs.

A configuration of the detection layer 51 is effective when a diameter of the detected fine particle P exceeds several hundreds of µm.

Figure 5:
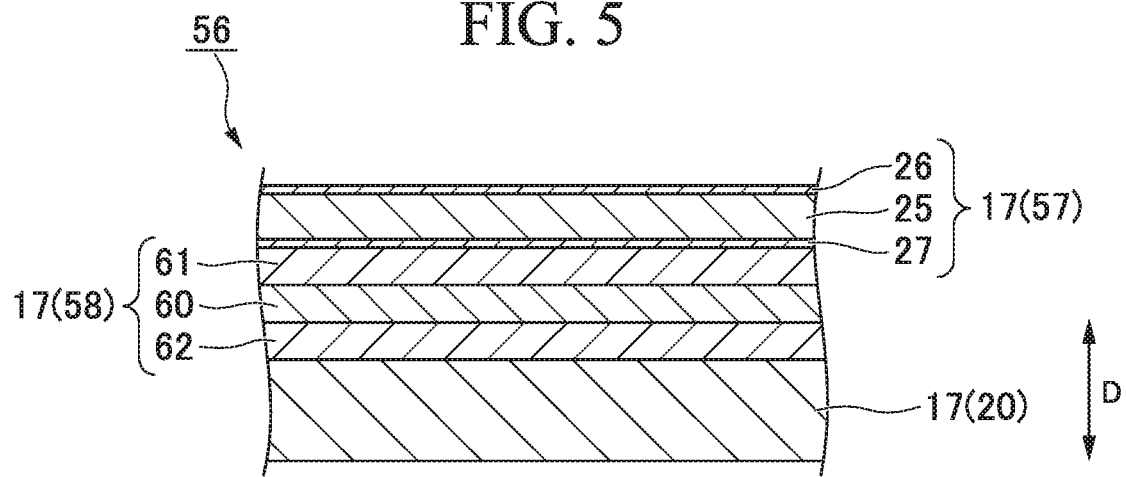
FIG. 5 is a cross-sectional view schematically showing a major part of a multi-layer insulation according to a modified example of the embodiment of the present invention.

As shown in FIG. 5, a multi-layer insulation 56 may have a configuration obtained by laminating a detection layer 57, a connecting film 58 and the intermediate layer film 20. Each of the detection layer 57 and the connecting film 58 is the layer 17.

The detection layer 57 is configured not to include the second protective film 28 with respect to the detection layer 19.

The connecting film 58 is configured by disposing adhesive layers 61 and 62 on both surfaces of a base layer 60. The base layer 60 is formed of polyimide or the like. The adhesive layer 61 is adhered to the second electrode layer 27 of the detection layer 57. The adhesive layer 62 is adhered to the intermediate layer film 20.

By adhering the detection layer 57 to the intermediate layer film 20 using the connecting film 58, a short circuit between the electrode layers 26 and 27 due to, for example, suturing the detection layer 57 using a needle can be prevented.

Figure 6:
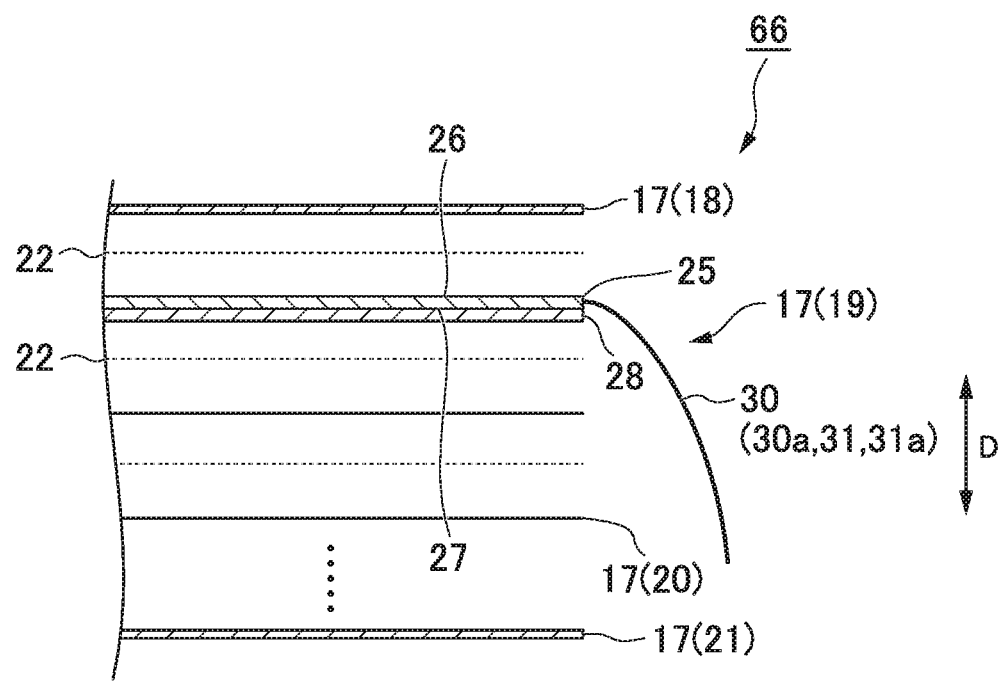
FIG. 6 is a cross-sectional view schematically showing a major part of a multi-layer insulation according to a modified example of the embodiment of the present invention.

Like a multi-layer insulation 66 shown in FIG. 6, in the multi-layer insulation 16 of the embodiment, the first electrical wire 30a of the first cable 30 may be connected to an end portion of the outer edge portion in the first electrode layer 26, and the second electrical wire 31a of the second cable 31 may be connected to an end portion of the outer edge portion in the second electrode layer 27. Further, FIG. 6 is an exploded view of the multi-layer insulation 66.

As configured above, there is no need to form the through-holes 20a and 21a in the intermediate layer film 20 and the innermost layer film 21.

While the embodiment of the present invention has been described in detail with reference to the accompanying drawings, the specific configuration is not limited to the embodiment, and modifications, combinations, deletions, and so on, may also be made without departing from the scope of the present invention.

For example, in the embodiment, the electrode layers 26 and 27 that are electrode parts are formed in a layered shape and disposed throughout the surfaces of the piezoelectric film 25. However, the electrode parts may be disposed on only parts of the surfaces of the piezoelectric film 25. Even in this case, the electrode parts are preferably thinly formed like the electrode layers 26 and 27.

The detection layer 19 may be disposed at an end of one side of the plurality of layers 17 in the lamination direction D.

The multi-layer insulation 16 may not include the interval holding member 22 and the cables 30 and 31.

(Experiment Results)

Next, experiment results using a multi-layer insulation will be described. A sphere formed of alumina was provided as an object to be detected, and the sphere collided with the multi-layer insulation using a two-stage light gas gun. A size of the multi-layer insulation was 500 mm×300 mm. A collision speed of the sphere was 7 km/sec.

Figure 7:
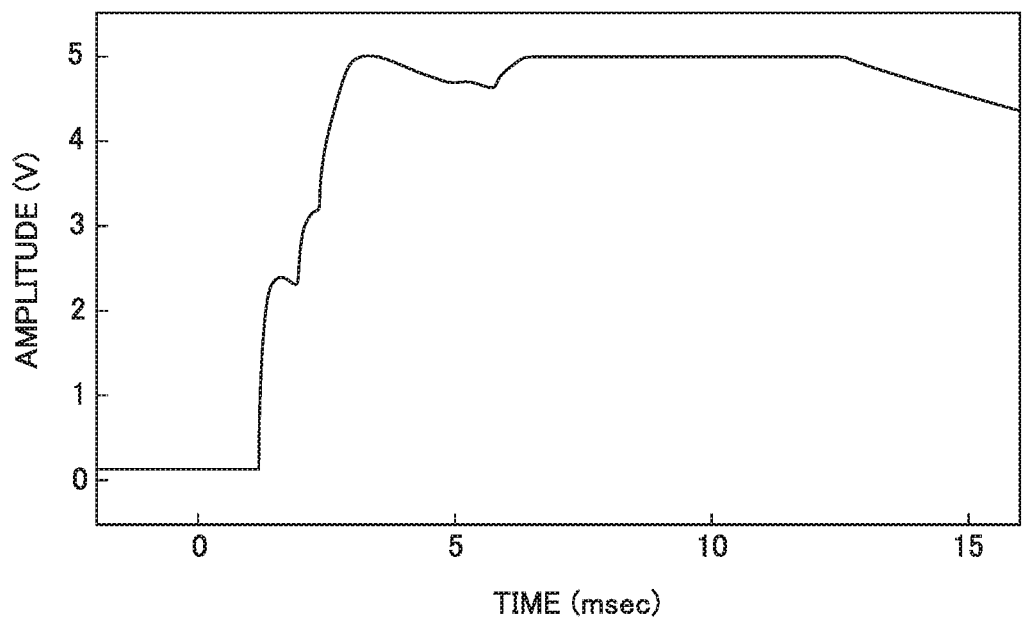
FIG. 7 is a view showing variation in amplitude of a potential difference detected by a detection unit with respect to time when a sphere collides with a multi-layer insulation in a case in which a diameter of the sphere is 0.3 mm.
Figure 8:
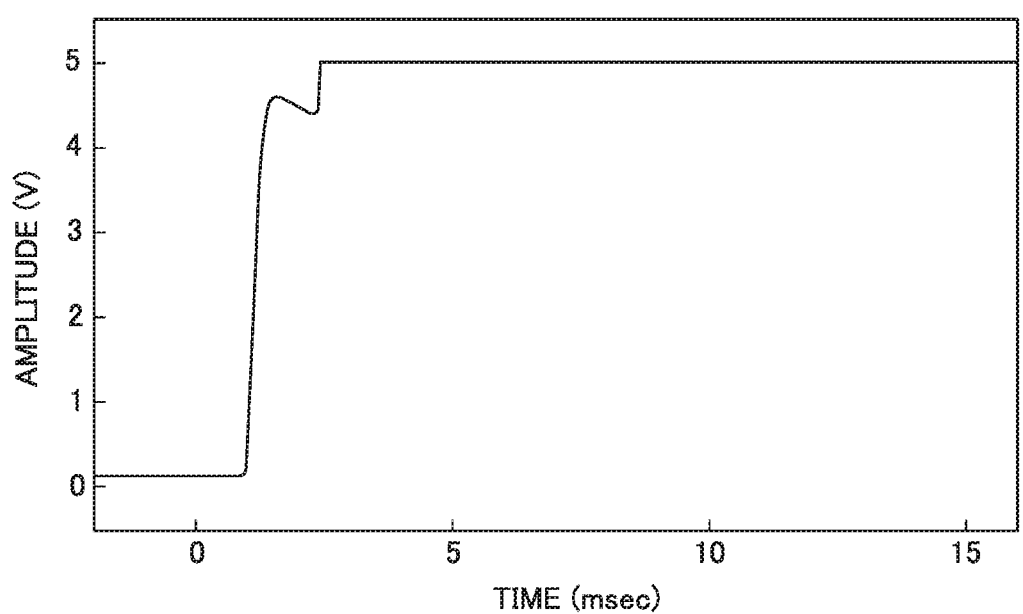
FIG. 8 is a view showing variation in amplitude of a potential difference detected by a detection unit with respect to time when a sphere collides with a multi-layer insulation in a case in which a diameter of the sphere is 1.2 mm.

FIG. 7 shows an experiment result when a diameter of the sphere is 0.3 mm. FIG. 8 shows an experiment result when a diameter of sphere is 1.2 mm. In both of FIG. 7 and FIG. 8, a horizontal axis represents a time (msec (millisecond))

from the beginning of an experiment. A vertical axis represents an amplitude (V (volt)) of a potential difference detected by a detection unit.

As shown in FIG. 7, before collision of the sphere (before about 1 msec on the horizontal axis), an amplitude of the potential difference was about 0 V. It was known that, when the sphere collides with the detection layer of the multi-layer insulation, the amplitude of the potential difference detected by the detection unit is abruptly increased. When a certain time elapses after collision of the sphere, the amplitude of the potential difference is attenuated to about 0 V. After that, when another sphere collides with the multi-layer insulation, as described above again, the amplitude of the potential difference is abruptly increased and then attenuated.

It was known that, when a diameter of the sphere is 1.2 mm as shown in FIG. 8, the amplitude of the potential difference is abruptly increased in comparison with the case in which the diameter of the sphere is 0.3 mm.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A multi-layer insulation comprising:
a plurality of layers that are laminated on each other;
a detection layer that is at least one of the plurality of layers;
a piezoelectric film provided in the detection layer; and
a pair of electrode parts installed on both surfaces of the piezoelectric film, one of the pair of the electrode parts being grounded and the other of the pair of the electrode parts being not grounded,
wherein the detection layer is not installed on at least one end of the plurality of layers in a lamination direction in which the plurality of layers are laminated.

2. The multi-layer insulation according to claim 1, wherein the detection layer is installed at a second layer of the plurality of layers from an end in the lamination direction.

3. A spacecraft comprising:
a main body;
a multi-layer insulation that covers an outer surface of the main body, the multi-layer insulation including:
a plurality of layers that are laminated on each other,
a detection layer that is at least one of the plurality of layers,
a piezoelectric film provided in the detection layer, and
a pair of electrode parts installed on both surfaces of the piezoelectric film, one of the pair of the electrode parts being grounded and the other of the pair of the electrode parts being not grounded, wherein the detection layer is not installed on at least one end of the plurality of layers in a lamination direction in which the plurality of layers are laminated;
a detector that is electrically connected to the detection layer and detects a potential difference between the pair of the electrode parts; and
a diagnoser that is electrically connected to the detector and diagnoses damage to the multi-layer insulation on the basis of a detection result of the detector.

4. A damage diagnoser comprising:
a multi-layer insulation including:
a plurality of layers that are laminated on each other,
a detection layer that is at least one of the plurality of layers,
a piezoelectric film provided in the detection layer, and
a pair of electrode parts installed on both surfaces of the piezoelectric film, one of the pair of the electrode parts being grounded and the other of the pair of the electrode parts being not grounded, wherein the detection layer is not installed on at least one end of the plurality of layers in a lamination direction in which the plurality of layers are laminated;
a detector that detects a potential difference between the pair of electrode parts; and
a diagnoser that diagnoses damage to the multi-layer insulation on the basis of a detection result of the detector.

5. A method of detecting an object to be detected, which detects that the object to be detected collide with a multi-layer insulation of a space craft, the space craft comprises:
the multi-layer insulation including:
a plurality of layers that are laminated on each other,
a detection layer that is at least one of the plurality of layers,
a piezoelectric film provided in the detection layer, and
a pair of electrode parts installed on both surfaces of the piezoelectric film, one of the pair of the electrode parts being grounded and the other of the pair of the electrode parts being not grounded, wherein the detection layer is not installed on at least one end of the plurality of layers in a lamination direction in which the plurality of layers are laminated;
a main body, the multi-layer insulation covering an outer surface of the main body;
a detector that is electrically connected to the detection layer and detects a potential difference between the pair of electrode parts; and
a diagnoser that is electrically connected to the detector and diagnoses damage to the multi-layer insulation on the basis of a detection result of the detector; and
the method comprising:
determining that the object to be detected collides with the detection layer when the potential difference between the pair of electrode parts exceeds a predetermined potential difference threshold.

6. A method of detecting an object to be detected, which detects that the object to be detected collide with a multi-layer insulation of a damage diagnoser, the damage diagnoser comprises:
the multi-layer insulation including:
a plurality of layers that are laminated on each other,
a detection layer that is at least one of the plurality of layers,
a piezoelectric film provided in the detection layer, and
a pair of electrode parts installed on both surfaces of the piezoelectric film, one of the pair of the electrode parts being grounded and the other of the pair of the electrode parts being not grounded, wherein the detection layer is not installed on at least one end of the plurality of layers in a lamination direction in which the plurality of layers are laminated;
a detector that is electrically connected to the detection layer and detects a potential difference between the pair of the electrode parts; and a diagnoser that is electrically connected to the detector and diagnoses damage to the multi-layer insulation on the basis of a detection result of the detector; and the method comprising:

determining that the object to be detected collides with the detection layer when the potential difference between the pair of electrode parts exceeds a predetermined potential difference threshold.

7. The spacecraft according to claim 3, wherein the detection layer is installed at a second layer of the plurality of layers from an end in the lamination direction.

8. The damage diagnoser according to claim 4, wherein the detection layer is installed at a second layer of the plurality of layers from an end in the lamination direction.

9. The method of detecting an object to be detected according to claim 5, which detects that the object to be detected collide with a multi-layer insulation of a space craft, wherein the detection layer is installed at a second layer of the plurality of layers from an end in the lamination direction.

10. A method of detecting an object to be detected according to claim 6, which detects that the object to be detected collide with a multi-layer insulation of a damage diagnoser, wherein the detection layer is installed at a second layer of the plurality of layers from an end in the lamination direction.

* * * * *